United States Patent [19]

Knechtli et al.

[11] Patent Number: 4,494,302
[45] Date of Patent: Jan. 22, 1985

[54] ACCELERATED ANNEALING OF GALLIUM ARSENIDE SOLAR CELLS

[75] Inventors: Ronald C. Knechtli, Woodland Hills; Robert Y. Loo, Los Angeles; G. Sanjiv Kamath, Malibu, all of Calif.

[73] Assignee: Hughes Aircraft Company, El Segundo, Calif.

[21] Appl. No.: 494,610

[22] Filed: May 16, 1983

Related U.S. Application Data

[62] Division of Ser. No. 246,360, Mar. 23, 1981, Pat. No. 4,395,293.

[51] Int. Cl.³ .................................................. H01L 31/18
[52] U.S. Cl. ..................................... 29/575; 29/585; 136/246; 136/262; 136/290
[58] Field of Search ................. 29/572, 575, 576 T, 29/585; 136/262, 246, 290, 245

[56] References Cited

U.S. PATENT DOCUMENTS 3,597,281  8/1971  Webb et al. .......................... 136/245

*Primary Examiner*—Aaron Weisstuch
*Attorney, Agent, or Firm*—David W. Collins; A. W. Karambelas

[57] ABSTRACT

A method is provided for accelerating and improving the recovery of GaAs solar cells from the damage which they experience in space under high energy particle irradiation such as electrons, protons and neutrons. The method comprises combining thermal annealing with injection annealing. Injection annealing is the recovery from radiation damage resulting from minority carrier injection into the damaged semiconductor, non-radiative minority carrier combination of the injected minority carriers, transfer of the recombination energy to the crystal lattice and utilization of this energy to remove the defects caused by the high energy particle irradiation. The combined annealing of this invention is implemented by heating the solar cells to a moderate temperature (on the order of about 200° C. to 300° C. or less), while at the same time injecting the minority carriers by either of two methods: current injection (by applying an adequate forward bias voltage) or photo-injection (by exposing the cell to adequate light intensity). Sunlight directed onto the solar cells may be employed for heating the solar cells. Alternatively, energy dissipation in the solar cells caused by the flow of a forward bias current may be used to heat the solar cells.

In one example, thermal annealing at 200° C. alone was observed to bring the power output up to a level of about 75% of its original value from a level of about 50%, resulting from radiation-induced damage. Combined annealing, employing thermal annealing at 200° C. in conjunction with simultaneous injection of minority carriers at a current density of 125 mA/cm², was observed to bring the power output to a level of nearly 90%.

4 Claims, 3 Drawing Figures

ACCELERATED ANNEALING OF GALLIUM ARSENIDE SOLAR CELLS

This is a division of application Ser. No. 246,360, filed Mar. 23, 1981, U.S. Pat. No. 4,395,293.

BACKGROUND OF THE INVENTION

1. Field of the Invention

This invention relates to gallium arsenide solar cells, and, more particularly, to methods of annealing out radiation damage in GaAs solar cells.

2. Description of the Prior Art

Radiation damage-induced degradation of the output of silicon solar arrays during the course of a space mission is a major problem in space power systems. Long term missions, and missions in or through regions of intense space radiation, will require either the ability to restore the array output to near beginning-of-life power or the use of solar arrays which exhibit little or no degradation.

The nature of radiation damage-induced defects, as well as their annealing kinetics, is only imperfectly known at present. Furthermore, there are currently no practical methods for cell annealing once a solar cell array has been deployed on a mission. An advanced technology concept with the potential to provide a radiation-hard solar power source incorporates gallium arsenide (GaAs) solar cells operating at elevated temperatures in concentrated sunlight. The concept, set forth in a Request for Proposal by NASA (RFP 3-183684Q, dated Apr. 2, 1980), utilizes three important features of GaAs solar cells compared to silicon: their apparent superior radiation hardness; a lower rate of cell output degradation as cell temperature increases; and lower annealing temperatures to remove radiation damage. Recent results indicate that it should be possible to operate GaAs cells at temperatures such that a significant amount of continuous thermal annealing of radiation damage occurs, while at the same time maintaining a reasonable level of cell output. A substantial loss of efficiency is, however, inherent to this system because of the relatively high temperature required when thermal annealing only is exploited.

Cover glasses are presently used to shield the solar cells from part of the damaging radiation. The effectiveness of such cover glass protection is, however, limited and leads to solar cell life limitations or weight penalties which are undesirable. Alternately, thermal annealing has also been proposed to limit solar cell radiation damage or recover from it. It has, however, not yet been implemented in any practical systems because of the relatively high annealing temperature and long annealing time required when thermal annealing alone is used.

SUMMARY OF THE INVENTION

In accordance with the invention, a method is provided for annealing out radiation damage in GaAs solar cells by combining thermal annealing with injection annealing. This method comprises:

(a) thermal annealing by maintaining the solar cells at a moderately elevated temperature for a period of time, while substantially simultaneously (b) injecting minority carriers into the damaged semiconductor to provide injection annealing simultaneously with the thermal annealing.

The minority carrier injection required for such combined annealing can be provided either by current injection (forward bias current) or photovoltaically (exposure to concentrated sunlight). The temperature required for thermal annealing can be provided by sunlight or by dissipation of energy caused by the flow of the forward bias current through the cells being annealed. The required injection current densities and/or concentration ratios are relatively modest.

The annealing is more effective when it is performed before the radiation fluence becomes high. This favors either continuous annealing or periodic annealing before the fluence builds up to about $10^{14}$ equivalent 1 MeV electrons/$cm^2$.

The combined annealing process of the invention leads to better recovery from radiation, lower annealing temperature and/or shorter annealing time and is therefore more attractive for practical application than the use of thermal annealing alone.

DETAILED DESCRIPTION OF THE INVENTION

Figure 1:
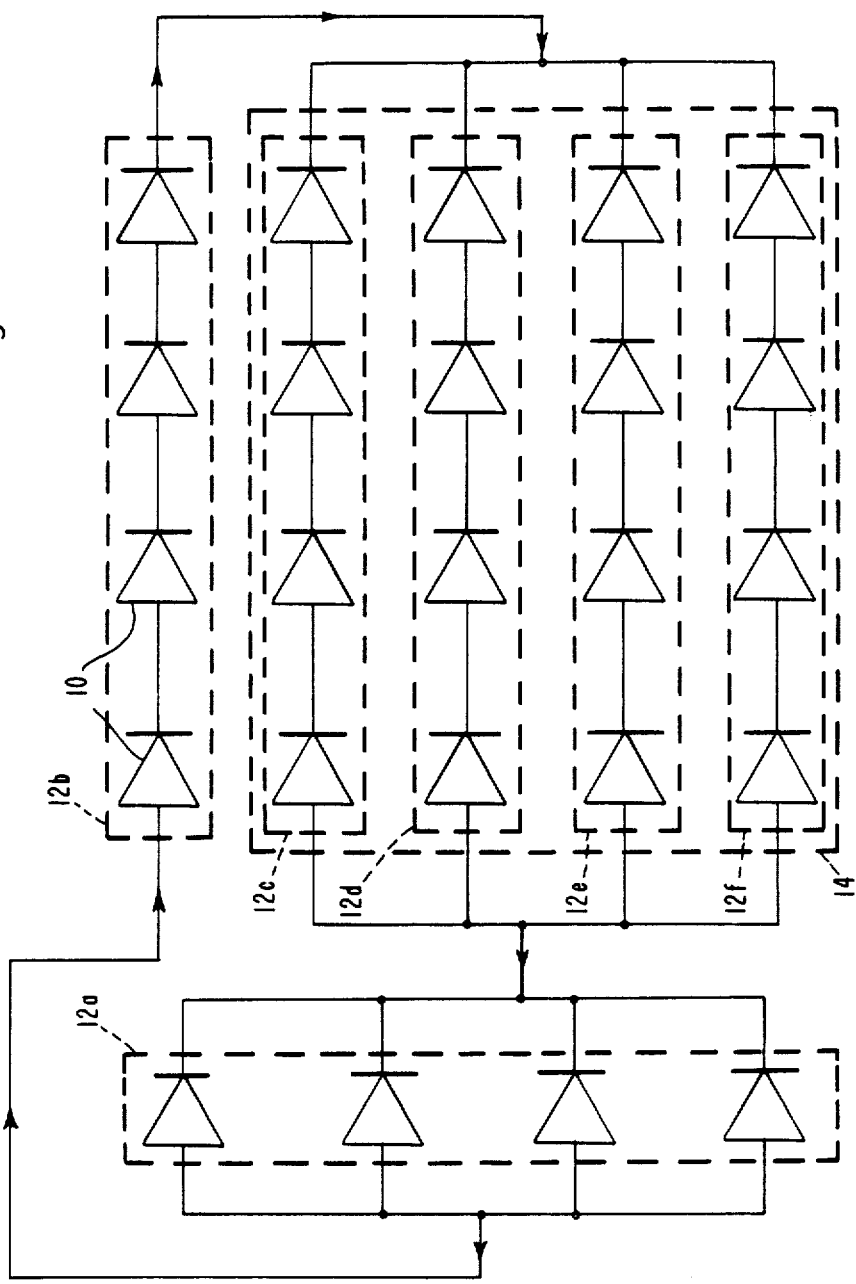
FIG. 1 depicts schematically a circuit for providing a forward bias current for combined annealing of GaAs solar cells.

1. Combined Annealing of GaAs Solar Cells

The principle of combined annealing of GaAs solar cells is to combine thermal annealing with injection annealing, the purpose being to recover from the damage caused to the solar cells by high energy particle irradiation. The annealing of radiation damage is accomplished by heating the solar cell to a moderately elevated temperature while providing substantially simultaneously an appropriate forward bias current. Representative values are a temperature between about 100° and 300° C. and a current density between about 20 and 200 mA/$cm^2$. Representative annealing times are on the order of 100 hours and can be even shorter at the higher temperatures.

An alternate method of injecting the required minority carriers is photovoltaic generation of these minority carriers. The required minority carrier photo-injection rate is obtained by illuminating the GaAs solar cells with concentrated sunlight. Here, the annealing of the radiation damage to the cell is accomplished by heating a cell, again to a moderate temperature, while illuminating it substantially simultaneously with concentrated sunlight. Representative values are a temperature about between 100° and 200° C., and a solar concentration ratio greater than 1. Solar concentration ratios greater than 10 and/or higher temperatures may be used but are not required to achieve useful combined annealing. Again, representative annealing times are on the order of 100 hours.

2. Periodically Annealed Solar Cell Panel Using Bias Current Injection

One method of exploiting combined annealing in a panel of GaAs solar cells is to subdivide this panel into a number of sections and to use the power and voltage from one part of the panel to forward bias the section to be annealed. This forces through the cells of the section being annealed the forward bias current needed for combined annealing. The energy dissipated in the annealed cells by the flow of this forward bias current is also used to heat these cells to the temperatures desired for their combined annealing The switching required between the individual sections of the solar cell to implement such combined annealing is relatively simple. As an example and referring to FIG. 1, consider a panel of solar cells (diodes 10) divided into six identical sections 12a-f of four cells each. For the sake of simplicity, assume that all solar cells are continuously exposed to AM0 illumination. To force a forward bias current through one of the sections will therefore require a moderate over-voltage above the open-circuit voltage of this section. An over-voltage on the order of 1.25 times the operating voltage of one section is estimated to suffice for this purpose.

Four of the panel sections (here, sections 12c-f) are connected in a group 14 such that the cells in each section 12c-f are connected in series and the sections are connected in parallel. The group 14 is then placed in series with the fifth section 12a after the four cells of the latter have all been placed in parallel with one another. The fifth section 12a will then provide the same current as the four sections 12c-f placed in parallel with one another, this fifth section current being provided at a voltage equal to ¼ of the voltage of the other four sections.

The total current provided by the five sections reconnected as described above is then four times the current provided by one section and the total voltage available is 1.25 times the voltage of one section. This current at this voltage is then used to provide the forward bias current needed for the combined annealing of the sixth section 12b.

The combined annealing is accordingly accomplished by forming m identical sections of solar cells from a panel of n solar cells, each section containing n/m solar cells. A forward bias is to be applied to one section. This is done by connecting m−2 of the sections in a group such that the cells in each section are connected in series and the sections are connected in parallel, leaving the section to be annealed and one remaining section. In the remaining section, the solar cells are connected in parallel; this section is connected in series with the group of m−2 sections. This section and the group of m−2 sections are then connected in series with the section of solar cells to be annealed, which are connected in series within that section. Consequently, the current provided by the m−1 sections is n/m times the current provided by one section and the voltage provided by the m−1 sections is [1+1/(n/m)] times the voltage provided by one section.

In order to be effective, the current provided to the section of solar cells being annealed should be at least about four times the photovoltaic short-circuit current of one solar cell, which is typically about 120 mA for a cell with an area of 4 cm². For reference, the open circuit voltage of one GaAs solar cell is about 1 V. In order to anneal all the solar cells, the connections shown in FIG. 1 are reformed so as to provide each section of solar cells with the desired current and voltage. In this fashion, the combined annealing method of the invention is cycled through each section of solar cells.

As far as the frequency at which the combined annealing is carried out, it appears that no substantial power loss due to radiation is expected even in the absence of annealing on GaAs solar cells in geosynchronous orbit for less than about five years. Subjecting the solar cells to combined annealing every five years and assuming that the annealing time required to anneal one section of the panel is 80 hours, then for six sections, the full panel of solar cells would be annealed in less than 500 hours. Over a period of five years, this represents about 1% of the total available time. Such periodic annealing therefore permits avoiding indefinitely any substantial power loss caused by radiation on a panel of GaAs solar cells in geosynchronous orbit. Combined annealing in accordance with the invention even annually would cost only about 5% of the spacecraft's time. Thus, spacecraft may be powered by GaAs solar cells in radiation environments of greater intensity than experienced by a satellite in geosynchronous orbit, and combined annealing in accordance with the invention may be employed periodically to anneal out radiation-induced damage.

3. Periodically Annealed Solar Cell Panel Using Photo-Injection

To exploit photo-injection for the combined annealing of GaAs solar cells, concentrated light is required. This process is therefore to be used in solar cell panels with solar concentrators. In the absence of special precautions, solar concentration will increase the solar cell temperature and will result in a penalty in solar cell efficiency. In a solar cell panel suitable for space applications, excessive increase of solar cell temperature under concentrated sunlight can be avoided by providing a radiator of adequate area to which the solar cells are thermally attached. As an example, a solar cell can be exposed to concentrated sunlight in a Cassegrain mirror concentrator in which the light is focussed by the secondary mirror on the solar cell attached to the front of the primary mirror. The back of the primary mirror can be made black and thus serve as a radiator dissipating the heat from the solar cell.

Figure 2:
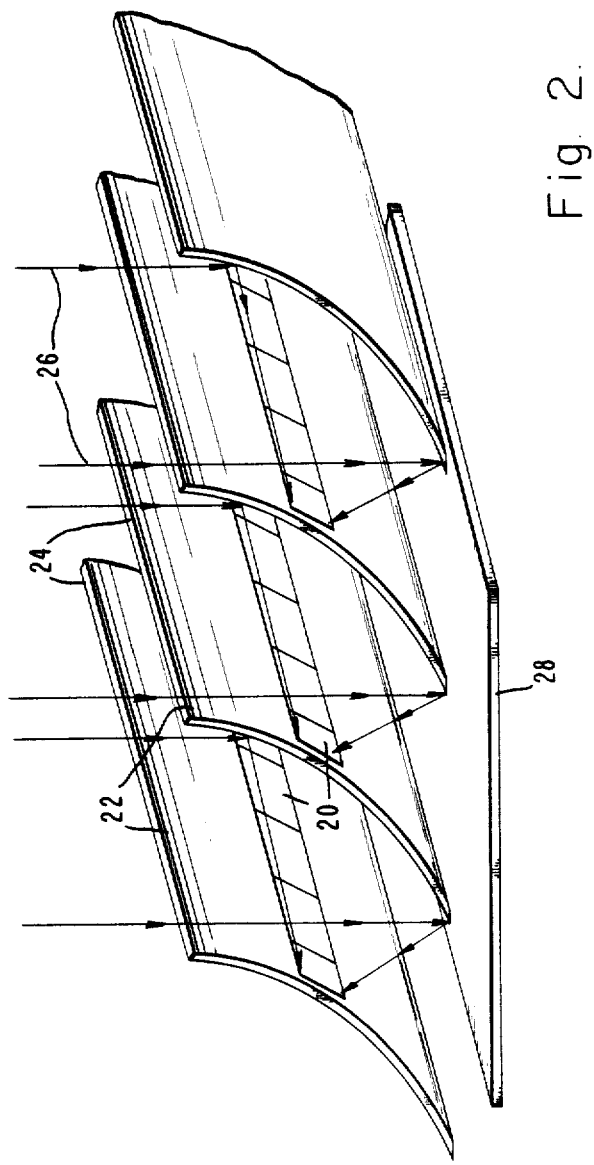
FIG. 2 depicts schematically a linear single mirror concentrator with movable mirror for adjusting the temperature of GaAs solar cells during combined annealing employing periodic photoinjection of minority carriers induced by sunlight.

A favorable compromise between radiator weight, dimensions, solar cell efficiency and temperature leads to a solar cell temperature too low for optimum recovery from radiation damage by combined annealing (e.g., less than about 100° C.). In such a case, the solar cell panel can be divided into groups of cells, each group being attached to its own thermally independent radiator. The temperature of an individual radiator and of the corresponding group of solar cells is then increased for a limited period of time. This leads to the combined annealing of this group of cells, under the concentrated sunlight to which they are exposed. The temperature of the radiator is increased by placing in front of it a movable mirror which acts as a radiation shield. One implementation of such a system is depicted in FIG. 2. A linear mirror concentrator is depicted, comprising a plurality of solar cells 20 mounted on the backs 22 of a plurality of curved mirrors 24. Incoming sunlight (rays 26) is reflected into the solar cells. The curved mirrors may also serve as radiators, as described above (by blackening the backsides 22). A movable mirror 28 acts as a radiation shield; when in position, it blocks radiation of heat from the radiating backside surface of the mirrors, thus increasing the temperature of the solar cells.

For illustrative purposes, the following example can be given. Assume that the radiator 22 is black (emissivity $\epsilon=1$) and that its area is chosen so that its temperature and that of the solar cells 20 which it supports is 100° C. This will lead to a heat radiation power density of 110 mW/cm² from the radiator area. If a heat shielding mirror 28 is introduced and configured to decrease the effective emissivity of the radiator from 1.0 down to $\epsilon=0.4$, the radiator and solar cell temperature will correspondingly increase from 100° C. up to about 200° C. at the same heat radiation power density. This increased temperature is in the range found useful for relatively rapid combined annealing.

4. Solar Cell Panel For Continuous Combined Annealing

Combined annealing using photo-injection of the minority carriers can be exploited continuously in a solar cell panel using concentrated sunlight, which simultaneously provides the desired thermal annealing. The penalty for continuous annealing is the continuous need of operating the solar cells at higher temperature. This results in a corresponding loss in solar cell efficiency. The advantage of this alternative is the fact that the total system is simpler and the solar panel electric power output is constant, the annealing taking place continuously while the radiation damage occurs. Because GaAs solar cells have a relatively large band gap and can therefore operate efficiently up to relatively high temperature, this trade-off may be appealing for some applications. For reference, the rate at which GaAs solar cell loses efficiency with increasing temperature is about 0.035%/°C. Hence, increasing the GaAs cell temperature from 25° C. to 150° C. results in a loss of efficiency of about 6% (i.e., dropping, for example, from an efficiency of 18% to an efficiency of about 12%). However, the recovery of output power is greater than that obtained from continuous thermal annealing alone.

In this embodiment of continuous combined annealing, a solar panel is configured to provide concentrated sunlight on the GaAs solar cells such that the concentrated sunlight heats the solar cells to the desired temperature. Guideline values for the solar concentration ratio required to provide the required minority carrier photo-injection is a concentration ratio greater than 1 and less than 10. The required solar cell temperature will be in the range between 100° and 200° C. Possible GaAs solar cell panel structures capable of operation with continuous combined annealing are the same as those already discussed in connection with periodic annealing by photo-injection.

It will be appreciated that methods and apparatus other than those specifically disclosed herein may be used to provide the combined thermal and injection annealing of the invention. As disclosed herein, sunlight may be employed periodically or continuously to provide both thermal annealing (heat) and injection annealing (photovoltaic), and a forward bias current may be used to provide both thermal annealing (dissipation of energy caused by current flow) and injection annealing (current injection). Other combinations employing sunlight and a forward bias current may also be employed to provide combined annealing, either periodically or continuously.

EXAMPLE

Figure 3:
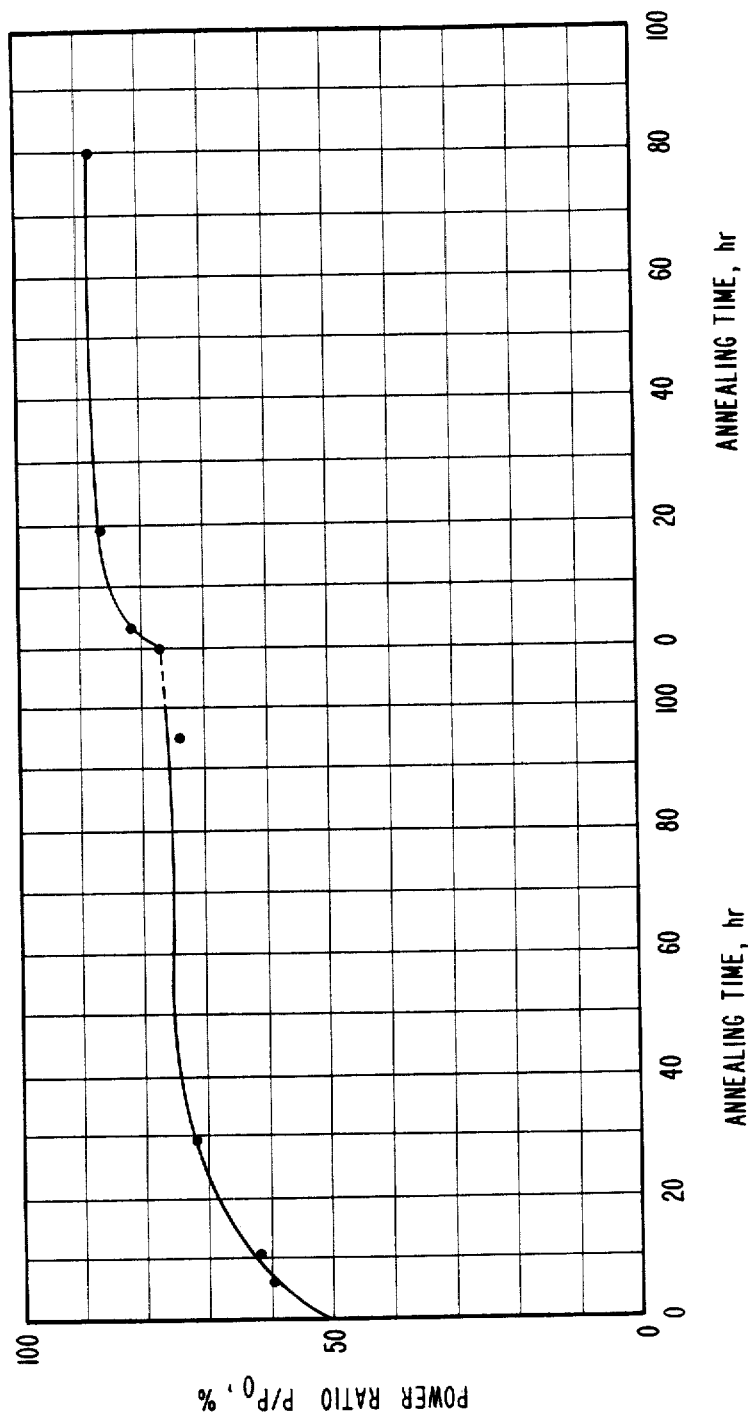
FIG. 3, on coordinates of power ratio and annealing time, depicts the effects of thermal annealing alone compared with the combined annealing of the invention on GaAs solar cells.

A conventional 2 cm×2 cm (Al,Ga)As-GaAs solar cell was subjected to 1 MeV electron irradiation at room temperature at a fluence of $10^{16}$ e/cm². Its photovoltaic power output P after irradiation was found to have degraded down to about 50% of its initial photovoltaic power output $P_o$, the photovoltaic measurements being performed under the same AM0 illumination at one Sun intensity before and after irradiation. Following irradiation, this cell was isothermally annealed at 200° C. in the absence of current flow or illumination. This thermal annealing led to a partial recovery of power output, $P/P_o$, increasing asymptotically from 0.50 up to a value of about 0.75 in less than 100 hours, shown on the left-hand plot in FIG. 3. As a next step, this same cell was subjected to simultaneous injection and thermal annealing in accordance with the invention by passing a forward bias current of 500 mA through the solar cell, which was held at the same temperature of 200° C. This combined annealing produced a much higher power recovery than thermal annealing alone. After combined annealing, the solar cell power P was observed to recover up to nearly 90% of its original value ($P/P_o \approx 0.90$) in less than 100 hours, as compared to a recovery of 75% with thermal annealing only, at the same temperature of 200° C. This result is illustrated in the right-hand plot in FIG. 3. For reference, it may be noted that the current of 500 mA used in this experiment corresponds to a current density of 125 mA/cm² (4 cm² solar cell) and is equal to no more than about five times the photovoltaic short circuit current of this cell under AM0 illumination at one Sun intensity.

As noted above, a solar cell power recovery of 90% was observed in the combined annealing experiment after irradiation by 1 MeV electrons at a fluence as high as $10^{16}$ e/cm². For reference, equivalent 1 MeV electron fluences of interest for satellites in geosynchronous orbit are typically $10^{15}$ e/cm², which is one order of magnitude lower than the fluence used above. Correlating the results of FIG. 3 with other observations suggests that combined annealing applied after irradiation with a fluence of $10^{15}$ e/cm² could produce practically 100% power.

What is claimed is:

1. Apparatus for annealing out radiation damage effects in GaAs solar cells in a panel comprising a plurality of n solar cells exposed to solar radiation, which comprises:
   (a) means for forming a number m of identical sections, each containing n/m solar cells;
   (b) means for providing a forward bias current to one section, said means comprising
      (1) means for combining m−2 sections in a group such that the solar cells in each section are connected in series and the sections are connected in parallel, leaving said one section and one remaining section,
      (2) means for combining the solar cells of the one remaining section in parallel,
      (3) means for combining the one remaining section in series with the group, and
      (4) means for combining the one remaining section and the group in series with said one section, thereby forming an annealing combination;
   (c) means for heating said one section; and
   (d) means for reforming and cycling the combination through each of the other sections.

2. The apparatus of claim 1 in which the combination of the group and the one remaining section generates a current of at least about four times the photovoltaic short-circuit current of one solar cell upon exposure to solar radiation.

3. The apparatus of claim 1 in which the forward bias current ranges from about 20 to 200 mA/cm².

4. The apparatus of claim 1 in which the means for providing a forward bias current to said one section generates a temperature of about 100° to 300° C. within said one section for heating said one section.

* * * * *